United States Patent
Hasegawa et al.

(10) Patent No.: US 10,325,827 B2
(45) Date of Patent: Jun. 18, 2019

(54) SEMICONDUCTOR DEVICE (71) Applicant: Mitsubishi Electric Corporation, Tokyo (JP)

(72) Inventors: Shigeru Hasegawa, Tokyo (JP); Kazuhiro Morishita, Tokyo (JP); Ryo Tsuda, Tokyo (JP); Yukimasa Hayashida, Fukuoka (JP); Goro Yasutomi, Fukuoka (JP); Ryutaro Date, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/888,009

(22) PCT Filed: May 29, 2013

(86) PCT No.: PCT/JP2013/064869
§ 371 (c)(1),
(2) Date: Oct. 29, 2015

(87) PCT Pub. No.: WO2014/192093
PCT Pub. Date: Dec. 4, 2014

(65) Prior Publication Data
US 2016/0079142 A1  Mar. 17, 2016

(51) Int. Cl.
*H01L 23/367* (2006.01)
*H01L 23/498* (2006.01)
(Continued)

(52) U.S. Cl.
CPC ...... *H01L 23/3675* (2013.01); *H01L 23/3735* (2013.01); *H01L 23/4006* (2013.01);
(Continued)

(58) Field of Classification Search
None
See application file for complete search history.

(56) References Cited

U.S. PATENT DOCUMENTS

| | | | |
|---|---|---|---|
| 6,353,258 B1 | 3/2002 | Inoue et al. | |
| 2010/0148823 A1* | 6/2010 | Shimizu | H01L 27/0629 326/102 |

(Continued)

FOREIGN PATENT DOCUMENTS

| | | |
|---|---|---|
| EP | 0828341 A2 | 3/1998 |
| JP | H08-195471 A | 7/1996 |

(Continued)

OTHER PUBLICATIONS

Translation of the International Preliminary Report on Patentability and Translation of Written Opinion of the International Searching Authority; PCT/JP2013/064869; dated Dec. 10, 2015.

(Continued)

*Primary Examiner* — Alexander G Ghyka
(74) *Attorney, Agent, or Firm* — Studebaker & Brackett PC (57) ABSTRACT

A base plate, and a plurality of unit structures formed on the base plate are provided. Each of the unit structures including an insulating substrate fixed on the base plate, a metal pattern formed on the insulating substrate, a semiconductor element electrically connected to the metal pattern, and a main electrode having an upper end portion exposed to the outside and a lower end portion connected to a peripheral portion of the metal pattern closest to an outer edge of the base plate.

20 Claims, 7 Drawing Sheets (51) Int. Cl.
  *H01L 29/16*   (2006.01)
  *H01L 23/373*  (2006.01)
  *H01L 23/40*   (2006.01)
  *H01L 25/07*   (2006.01)
  *H01L 23/492*  (2006.01)
  *H01L 29/20*   (2006.01)

(52) U.S. Cl.
  CPC ...... *H01L 23/492* (2013.01); *H01L 23/49811* (2013.01); *H01L 23/49838* (2013.01); *H01L 25/072* (2013.01); *H01L 29/1602* (2013.01); *H01L 29/1608* (2013.01); *H01L 29/2003* (2013.01); *H01L 2023/4087* (2013.01); *H01L 2224/48091* (2013.01); *H01L 2224/48137* (2013.01); *H01L 2924/13055* (2013.01)

(56) References Cited

U.S. PATENT DOCUMENTS

| | | |
|---|---|---|
| 2011/0285459 A1 | 11/2011 | Uemura |
| 2012/0256194 A1 | 10/2012 | Yoshihara et al. |
| 2014/0061673 A1 | 3/2014  | Miyanagi |
| 2014/0138707 A1 | 5/2014  | Miki et al. |

FOREIGN PATENT DOCUMENTS

| | | |
|---|---|---|
| JP | H10-125856 A  | 5/1998 |
| JP | 2001-144251 A | 5/2001 |
| JP | 2002-125381 A | 4/2002 |
| JP | 2003-243610 A | 8/2003 |
| JP | 2011-243847 A | 12/2011 |
| JP | 2012-064609 A | 3/2012 |
| WO | 2010/131679 A1 | 11/2010 |
| WO | 2012172991 A1 | 12/2012 |
| WO | 2013/008424 A1 | 1/2013 |

OTHER PUBLICATIONS

An Office Action; "Notification of Reason for Rejection" issued by the Japanese Patent Office dated Jan. 24, 2017, which corresponds to Japanese Patent Application No. 2015-519537 and is related to U.S. Appl. No. 14/888,009; with English language partial translation.

An Office Action; "Notification of Reasons for Rejection," issued by the Japanese Patent Office dated Jun. 7, 2016, which corresponds to Japanese Patent Application No. 2015-519537 and is related to U.S. Appl. No. 14/888,009; with English language partial translation.

An Office Action issued by the Chinese Patent Office dated Jun. 8, 2017, which corresponds to Chinese Patent Application No. 201380077017.0; with partial English language translation.

An Office Action; "Notice of Preliminary Rejection" issued by the Korean Patent Office dated Mar. 10, 2017, which corresponds to Korean Patent Application No. 10-2015-7033598 and is related to U.S. Appl. No. 14/888,009; with partial English language translation.

An Office Action issued by the German Patent Office dated Feb. 16, 2018, which corresponds to German Patent Application No. 112013007122.3 and is related to U.S. Appl. No. 14/888,009; with English translation.

An Office Action issued by the Korean Patent Office dated Feb. 2, 2018, which corresponds to Korean Patent Application 10-2017-7031958 and is related to U.S. Appl. No. 14/888,009. with English translation.

An Office Action mailed by the State Intellectual Property Office of the People's Republic of China dated Mar. 27, 2018, which corresponds to Chinese Patent Application No. 201380077017.0 and is related to U.S. Appl. No. 14/888,009.

An Office Action mailed by the Japanese Patent Office dated Jun. 5, 2018, which corresponds to Japanese Patent Application No. 2017-180051 and is related to U.S. Appl. No. 14/888,009.

An Office Action mailed by the State Intellectual Property Office of People's Republic of China dated Aug. 20, 2018, which corresponds to Chinese Patent Application No. 201380077017.0 and is related to U.S. Appl. No. 14/888,009.

An Office Action mailed by the State Intellectual Property Office of People's Republic of China dated Feb. 26, 2019, which corresponds to Chinese Patent Application No. 201380077017.0 and is related to U.S. Appl. No. 14/888,009.

* cited by examiner

SEMICONDUCTOR DEVICE

TECHNICAL FIELD

This invention relates to a semiconductor device for use, for example, in electric railways and wind power generation systems.

BACKGROUND ART

A semiconductor device such as an insulated gate bipolar transistor (IGBT) module is used, for example, for electric power control on a motor. Patent Literature 1 discloses a semiconductor device having a semiconductor element such as an IGBT. This semiconductor device has a main electrode connected to a metal pattern electrically connected to the semiconductor element.

PRIOR ART

Patent Literature

Patent Literature 1: Japanese Patent Laid-Open No. 2012-64609

SUMMARY OF INVENTION

Technical Problem

In some cases, the metal pattern and the main electrode are connected to each other, for example, by using solder. At the time of turning-on, i.e., causing a main current to flow through the semiconductor device, at the time of maintaining steady flowing of the main current and at the time of turning-off, i.e., shutting off the main current, lost energy in the semiconductor element becomes thermal energy causing an increase in temperature of the semiconductor device. When the semiconductor device is not energized during a long time period, the temperature of the semiconductor device decreases to an external environment temperature (low temperature). With repetition of change between a high-temperature state and a low-temperature state, parts in the semiconductor device are thermally expanded and contracted repeatedly. There is a problem that the connection between the metal pattern and the main electrode is degraded by this thermal expansion and contraction. There is a problem that with the progress of this degradation the main electrode separates from the metal pattern.

The present invention has been achieved to solve the above-described problem, and an object of the present invention is to provide a semiconductor device capable of inhibiting degradation of the connection between the metal pattern and the main electrode.

Means for Solving the Problems

According to the present invention, there is provided a semiconductor device including a base plate, and a plurality of unit structures formed on the base plate. Each of the unit structures including an insulating substrate fixed on the base plate, a metal pattern formed on the insulating substrate, a semiconductor element electrically connected to the metal pattern, and a main electrode having an upper end portion exposed to the outside and a lower end portion connected to a peripheral portion of the metal pattern closest to an outer edge of the base plate.

According to the present invention, there is also provided a semiconductor device, including a base plate formed into a rectangular shape as viewed in plan and having a plurality of first through holes formed along a first side and a plurality of second through holes formed along a second side opposite from the first side, and a plurality of unit structures formed on the base plate. Each of the unit structures including an insulating substrate fixed on the base plate, a metal pattern formed on the insulating substrate, a semiconductor element electrically connected to the metal pattern, and a main electrode having an upper end portion exposed to the outside and a lower end portion connected to the metal pattern. Each of the lower end portions is located closer to the first side than a place defined by an advance from the first side toward the second side by ¼ of the distance from the first side to the second side or closer to the second side than a place defined by an advance from the second side toward the first side by ¼ of the distance from the second side to the first side.

Other features of the present invention will be clarified in the following.

Advantageous Effect of Invention

According to this invention, degradation of the connection between the metal pattern and the main electrode can be inhibited.

DESCRIPTION OF EMBODIMENTS

A semiconductor device according to embodiments of the present invention will be described with reference to the drawings. Components identical or corresponding to each other are assigned the same reference characters and repeated description for them is omitted in some cases.

Embodiment 1

Figure 1:
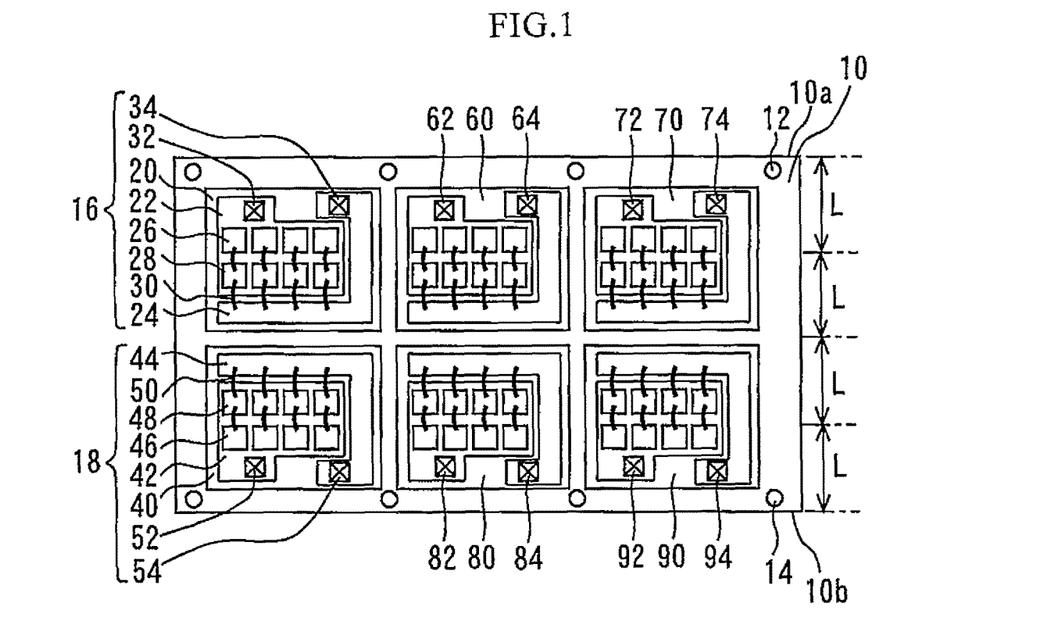
FIG. 1 is a plan view of the internal structure of a semiconductor device according to Embodiment 1 of the present invention.

FIG. 1 is a plan view of the internal structure of a semiconductor device according to Embodiment 1. This semiconductor device is provided with a base plate 10. The base plate 10 is formed into, for example, a rectangular shape as viewed in plan. A plurality of first through holes 12 are formed in the base plate 10 along a first side 10*a* of the base plate 10. A plurality of second through holes 14 are also formed in the base plate 10 along a second side 10*b* of the base plate 10 opposite from the first side 10*a*.

A plurality of unit structures are formed on the base plate 10. The plurality of unit structures include three first unit structures 16, 60, and 70 and three second unit structures 18, 80, and 90. The three first unit structures 16, 60, and 70 are formed nearer to and along the first side 10*a* of the base plate 10. The three second unit structures 18, 80, and 90 are formed nearer to and along the second side 10*b* of the base plate 10. The three first unit structures 16, 60, and 70 and the three second unit structures 18, 80, and 90 are bilaterally symmetrical about an imaginary line extending between and parallel to the first side 10*a* and the second side 10*b*.

The first unit structures will first be described. The three first unit structures 16, 60, and 70 are identical in construction to each other. Description will therefore be made below of the first unit structure 16. The first unit structure 16 has an insulating substrate 20 fixed on the base plate 10. A first metal pattern 22 and a second metal pattern 24 insulated from the first metal pattern 22 are formed on the insulating substrate 20. Each of the first metal pattern 22 and the second metal pattern 24 is formed, for example, of copper or aluminum. The length of the second metal pattern 24 along the direction in which a main current flows is larger than twice the width of the second metal pattern 24.

The first unit structure 16 is provided with four IGBTs 26 and four diodes 28. Each IGBT 26 has an emitter in its front surface and a collector in its back surface. Each diode 28 has an anode in its front surface and a cathode in its back surface. The collector of the IGBT 26 and the cathode of the diode 28 are connected to the first metal pattern 22. This connection is made, for example, by means of solder. The emitter of the IGBT 26 and the anode of the diode 28 are electrically connected to the second metal pattern 24 by wires 30 formed of aluminum for example.

A first lower end portion 32 of a first main electrode is connected to the first metal pattern 22. A first lower end portion 34 of a second main electrode is connected to the second metal pattern 24. For ease of description, portions of the first and second main electrodes other than the lower end portions are omitted in FIG. 1.

The second unit structures will subsequently be described. The three second unit structures 18, 80, and 90 are identical in construction to each other. Description will therefore be made below of the second unit structure 18. The second unit structure 18 has an insulating substrate 40 fixed on the base plate 10. A first metal pattern 42 and a second metal pattern 44 insulated from the first metal pattern 42 are formed on the insulating substrate 40. Each of the first metal pattern 42 and the second metal pattern 44 is formed, for example, of copper or aluminum.

The second unit structure 18 is provided with four IGBTs 46 and four diodes 48. The IGBTs 46 and the diodes 48 are the same as the above-described IGBTs 26 and diodes 28. The collector of the IGBT 46 and the cathode of the diode 48 are connected to the first metal pattern 42. This connection is made, for example, by means of solder. The emitter of the IGBT 46 and the anode of the diode 48 are electrically connected to the second metal pattern 44, for example, by wires 50 formed of aluminum.

A second lower end portion 52 of the first main electrode is connected to the first metal pattern 42. A second lower end portion 54 of the second main electrode is connected to the second metal pattern 44. The second unit structure 18 has the above-described construction. In FIG. 1 and other subsequent figures, wiring for supplying voltages to the gates of the IGBTs 26 and 46, emitter sense auxiliary electrodes, gate auxiliary electrodes, collector sense electrodes and other parts, provided in the actual semiconductor device, are omitted.

As is apparent from FIG. 1, the first unit structure 60 includes first lower end portions 62 and 64. The first unit structure 70 includes first lower end portions 72 and 74. The second unit structure 80 includes second lower end portions 82 and 84. The second unit structure 90 includes second lower end portions 92 and 94. The first lower end portions 32, 34, 62, 64, 72, and 74 are arranged along the plurality of first through holes 12. The second lower end portions 52, 54, 82, 84, 92, and 94 are arranged along the plurality of second through holes 14.

The first lower end portions 32, 34, 62, 64, 72, and 74 are positioned closer to the first side 10*a* than a place defined by an advance from the first side 10*a* toward the second side 10*b* by ¼ of the distance from the first side 10*a* to the second side 10*b*. This position is referred to as a first side position. On the other hand, the second lower end portions 52, 54, 82, 84, 92, and 94 are positioned closer to the second side 10*b* than a place defined by an advance from the second side 10*b* toward the first side 10*a* by ¼ of the distance from the second side 10*b* to the first side 10*a*. This position is referred to as a second side position. Accordingly, each of the lower end portions (every one of the first lower end portions 32, 34, 62, 64, 72, and 74 and the second lower end portions 52, 54, 82, 84, 92, and 94) is at the first side position or the second side position.

Figure 2:
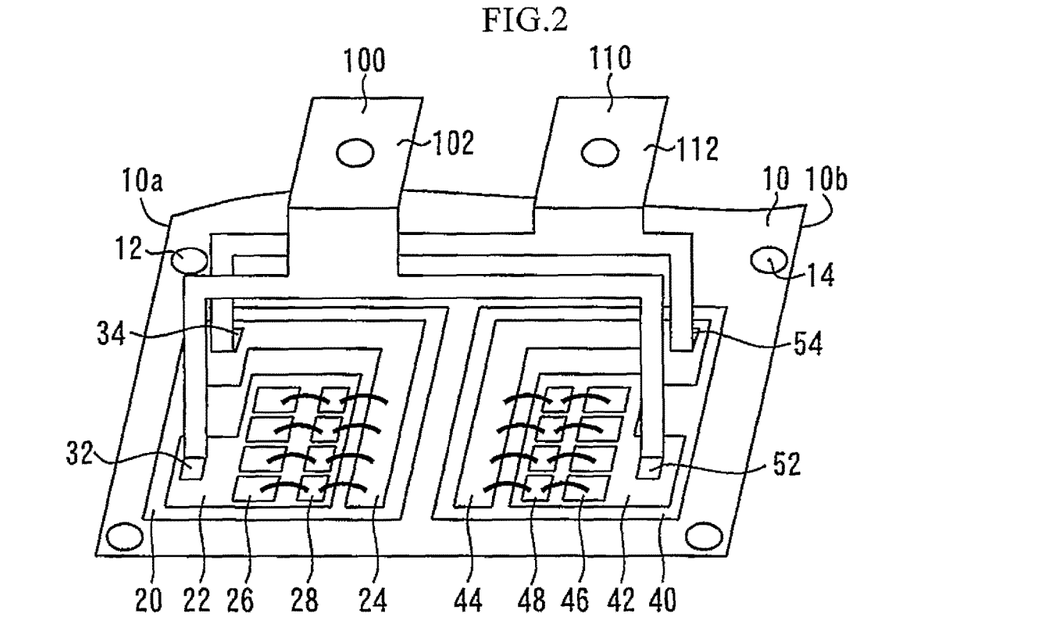
FIG. 2 is a perspective view of main electrodes and other components.

FIG. 2 is a perspective view of main electrodes and other components. In FIG. 2, a first main electrode 100 and a second main electrode 110 are illustrated. An upper end portion 102 of the first main electrode 100 is a portion exposed to the outside. The first main electrode 100 has the first lower end portion 32 and the second lower end portion 52. The first lower end portion 32 and the second lower end portion 52 are connected to the first metal pattern 22 and the first metal pattern 42, respectively, by means of solder for example. The first main electrode 100 functions as a collector main electrode.

An upper end portion 112 of the second main electrode 110 is a portion exposed to the outside. The second main electrode 110 has the first lower end portion 34 and the second lower end portion 54. The first lower end portion 34 and the second lower end portion 54 are connected to the second metal pattern 24 and the second metal pattern 44, respectively, by means of solder for example. The second main electrode 110 functions as an emitter main electrode.

Thus, the first unit structure 16 and the second unit structure 18 share one first main electrode 100. The first unit structure 16 and the second unit structure 18 also share one second main electrode 110. Similarly, the first unit structure 60 and the second unit structure 80 share one first main electrode and one second main electrode. Also, the first unit structure 70 and the second unit structure 90 also share one first main electrode and one second main electrode.

Figure 3:
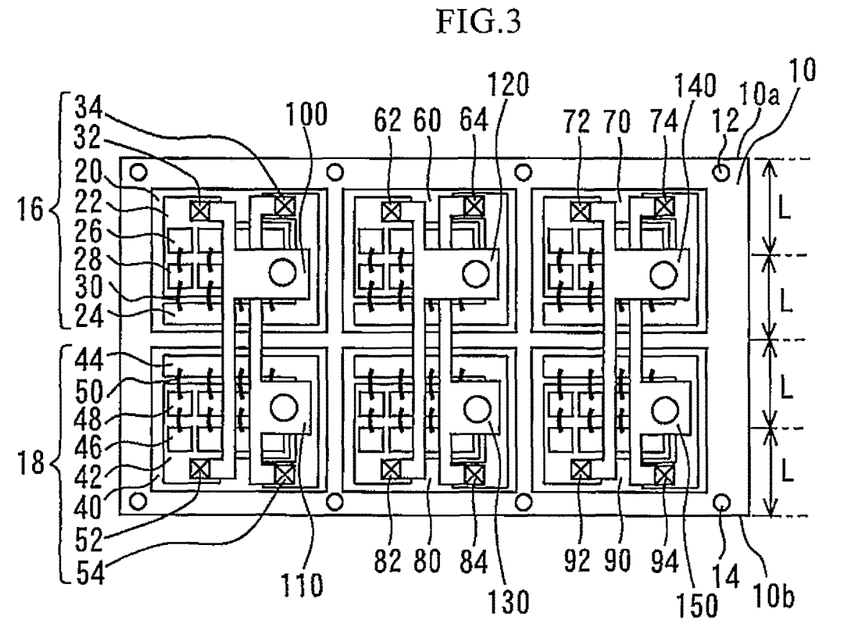
FIG. 3 is a plan view of main electrodes and other components.

FIG. 3 is a plan view of main electrodes and other components. The semiconductor device according to Embodiment 1 of the present invention is provided with main electrodes: first main electrodes 100, 120, and 140 and second main electrodes 110, 130, and 150. Each of the lower end portions is connected to a peripheral portion of the metal pattern (denoted as first metal pattern or second metal pattern) closest to the outer edge of the base plate 10 (referred to simply as "peripheral portion" in some places below).

Figure 4:
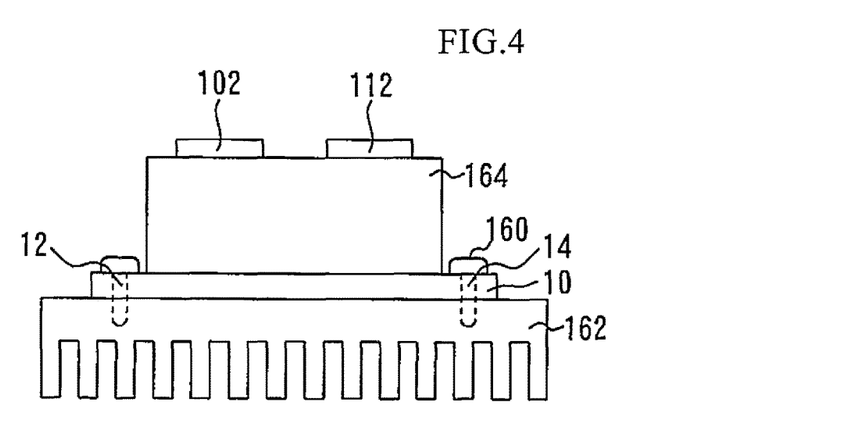
FIG. 4 is a side view of the semiconductor device according to Embodiment 1 of the present invention.

FIG. 4 is a side view of the semiconductor device according to Embodiment 1 of the present invention. Screws 160 are passed through the plurality of first through holes 12 and the plurality of second through holes 14. The back surface of the base plate 10 is maintained in thermal contact with (connected to) a heat sink 162 with the screws 160. Grease may be applied between the base plate 10 and the heat sink 162. The plurality of unit structures are covered with a case 164 on the base plate 10. The upper end portions 102 and 112 of the main electrodes are exposed from an upper surface of the case 164.

Figure 5:
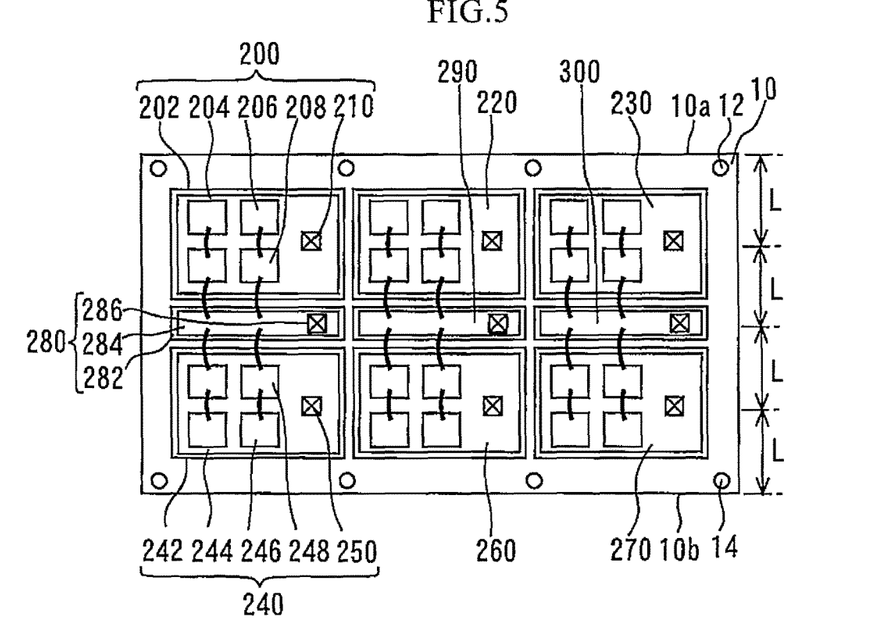
FIG. 5 is a plan view of the internal structure of a semiconductor device according to the comparative example.

A comparative example is described below before description of the meaning of the semiconductor device according to Embodiment 1 of the present invention. FIG. 5 is a plan view of the internal structure of a semiconductor device according to the comparative example. Three upper unit structures 200, 220, and 230 are formed nearer to and along a first side 10a of a base plate 10. Three lower unit structures 240, 260, and 270 are formed nearer to and along a second side 10b of the base plate 10. Intermediate unit structures 280, 290, and 300 are formed between the upper unit structures 200, 220, and 230 and lower unit structures 240, 260, and 270 on the base plate 10.

The three upper unit structures 200, 220, and 230 are identical in construction to each other. Description will therefore be made below of the upper unit structure 200. The upper unit structure 200 has an insulating substrate 202. A metal pattern 204 is formed on the insulating substrate 202. The collector of an IGBT 206 and the cathode of a diode 208 are connected to the metal pattern 204, for example, by solder. A first lower end portion 210 of a first main electrode is connected to the metal pattern 204, for example, by solder.

The three lower unit structures 240, 260, and 270 are identical in construction to each other. Description will therefore be made below of the lower unit structure 240. The lower unit structure 240 has an insulating substrate 242. A metal pattern 244 is formed on the insulating substrate 242. The collector of an IGBT 246 and the cathode of a diode 248 are connected to the metal pattern 244, for example, by solder. A second lower end portion 250 of the first main electrode is connected to the metal pattern 244, for example, by solder.

The three intermediate unit structures 280, 290, and 300 are identical in construction to each other. Description will therefore be made below of the intermediate unit structure 280. The intermediate unit structure 280 has an insulating substrate 282. A metal pattern 284 is formed on the insulating substrate 282. The emitters of the IGBTs 206 and 246 and the anodes of the diodes 208 and 248 are electrically connected to the metal pattern 284 by wires. A lower end portion 286 of a second main electrode is connected to the metal pattern 284, for example, by solder.

As is apparent from FIG. 5, the first lower end portion 210 is not connected to a peripheral portion which is a portion of the metal pattern 204 closest to the outer edge of the base plate 10. The second lower end portion 250 is not connected to a peripheral portion which is a portion of the metal pattern 244 closest to the outer edge of the base plate 10. Since lower end portion 286 is formed at a position between the first side 10a and the second side 10b, it is not at a first side position or a second side position.

Figure 6:
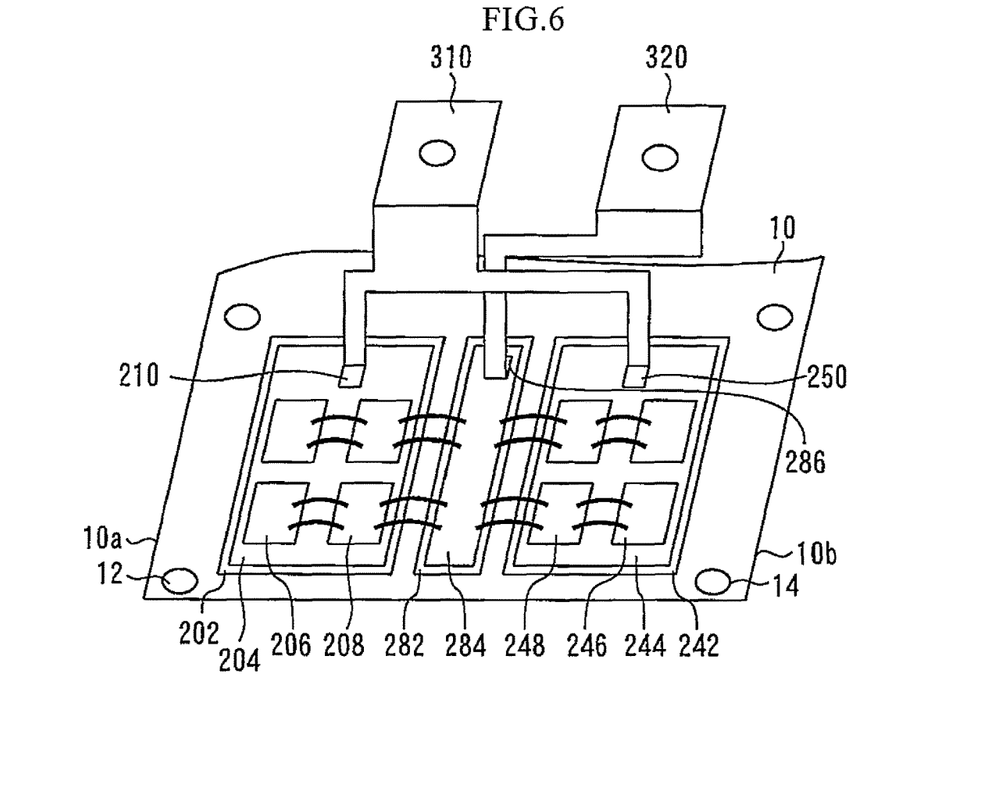
FIG. 6 is a perspective view of main electrodes and other components in the comparative example.
Figure 7:
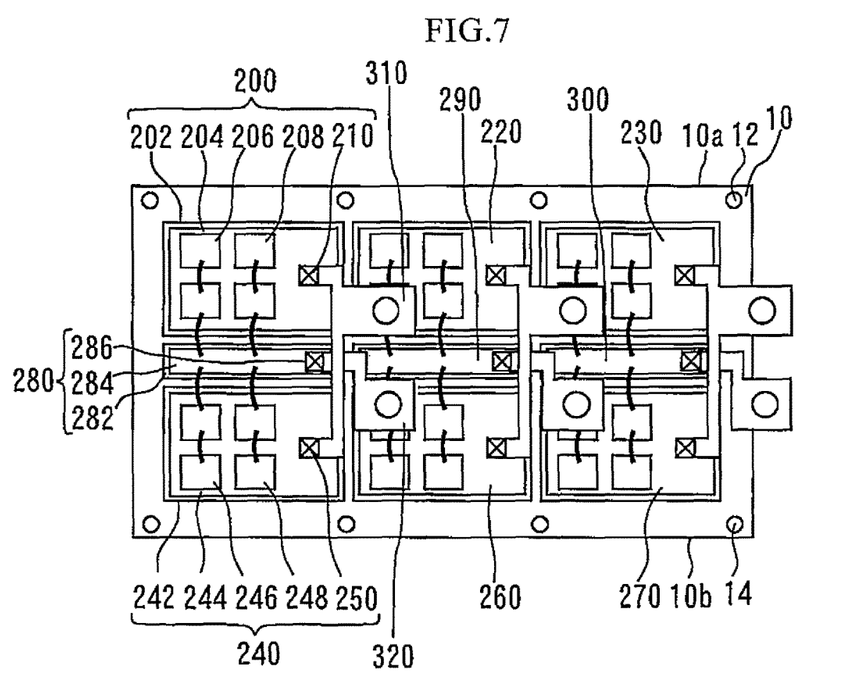
FIG. 7 is a plan view of the main electrodes and other components in the comparative example.

FIG. 6 is a perspective view of main electrodes and other components in the comparative example. In FIG. 6, a first main electrode 310 and a second main electrode 320 are illustrated. In terms of length in a direction from the first side 10a toward the second side 10b (referred to as "transverse direction length"), the first main electrode 310 is shorter than the above-described first main electrode 100. Also, the transverse direction length of the second main electrode 320 is shorter than the transverse direction length of the above-described second main electrode 110. FIG. 7 is a plan view of the main electrodes and other components in the comparative example. The semiconductor device in the comparative example has the above-described construction.

The amount of heat dissipation at a position close to the outer edge of the base plate 10 is larger than the amount of heat dissipation at a central position in the base plate 10. In the semiconductor device according to Embodiment 1 of the present invention, each of the lower end portions of the main electrodes is connected to a peripheral portion of the metal pattern closest to the outer edge of the base plate 10. Degradation of the connections between the metal pattern and the main electrodes (hereinafter referred to simply as "connection") can therefore be inhibited by increasing the amounts of heat dissipation at the connections.

In the case of the comparative example, there is a possibility of failure to dispose the connection of the intermediate unit structure in the vicinity of the outer edge of the base plate due to the existence of the intermediate unit structure between the upper unit structure and the lower unit structure. In the semiconductor device according to Embodiment 1 of the present invention, however, the second metal pattern 24 is provided in the first unit structure 16 and the second metal pattern 44 is provided in the second unit structure 18, thereby eliminating the need for the intermediate unit structure in the comparative example. As a result, all the connections can be disposed in the vicinity of the outer edge of the base plate.

The base plate 10 and the heat sink 162 are connected to each other with the screws 160 inserted in the plurality of first through holes 12 and the plurality of second through holes 14. Therefore, the portion of the base plate 10 along the plurality of first through holes 12 or the plurality of second through holes 14 is strongly pressed against the heat sink 162. As a result, the amount of heat dissipation from the portion of the base plate 10 along the plurality of first through holes 12 or the plurality of second through holes 14 is larger than that from a central portion of the base plate 10.

In the semiconductor device according to Embodiment 1 of the present invention, all the lower end portions (connections) of the main electrodes are arranged along the plurality of first through holes 12 or the plurality of second through holes 14. Degradation of the connections can therefore be inhibited by increasing the amounts of dissipation of heat by the heat sink 162 at the connections. From the viewpoint of making sufficiently large the amounts of dissipation of heat by the heat sink 162 at the connections, it is preferable that each of the connections (all the lower end portions) be at the first side position or the second side position.

The maximum temperatures of the connections can be lowered by bringing the connections closer to the outer edge of the base plate 10 and by arranging the connections along the plurality of first through holes 12 or the plurality of second through holes 14 in the above-described way. The thermal cycle life of the semiconductor device (the time period from a start of use of the semiconductor device to separation of some of the main electrodes from the metal patterns) can therefore be extended.

Each of the main electrodes according to Embodiment 1 of the present invention has the first lower end portion connected to the peripheral portion of the first unit structure at the first side 10*a*, and the second lower end portion connected to the peripheral portion of the second unit structure at the second side 10*b*. Accordingly, all the main electrodes according to Embodiment 1 of the present invention are longer in transverse direction length than the main electrodes in the comparative example. The main electrodes longer in transverse direction length can have a spring effect and reduce stress in the connections when component parts of the semiconductor device is thermally expanded or contracted. Degradation of the connections can therefore be inhibited.

In Embodiment 1 of the present invention, the plurality of unit structures have the three first unit structures 16, 60, and 70 and the three second unit structures 18, 80, and 90. However, the present invention is not limited to this. The internal construction of the unit structures and the number of unit structures are not limited as long as a plurality of unit structures having lower end portions of main electrodes connected to peripheral portions are provided.

From the viewpoint of unification of the reliabilities of one connection and another connection, it is preferable that, in each unit structure, the lower end portion of each main electrode be connected to an outer peripheral portion, and that, with respect to all the connections, the distances from the outer edge of the base plate 10 to the connections be equal to each other.

The significant feature of the present invention resides in the provision of a plurality of unit structures having lower end portions of main electrodes connected to peripheral portions. From this feature, if the amounts of heat dissipation from the connections can be made sufficiently large, arranging the connections along the plurality of first through holes 12 or the plurality of second through holes 14, disposing each connection at the first side position or the second side position and increasing the transverse direction length of each main electrode are not necessarily required.

The shape of the base plate 10 is not particularly specified restrictively. For example, four unit structures may be formed on a substantially square base plate. In a case where through holes are formed at four corners of a square base plate, the effect of dissipating heat with the heat sink is increased in a place along the outer edge of the base plate and, therefore, arranging the connections along the outer edge of the base plate may suffice. A cooling device other than the heat sink 162 may be used. For example, a water cooling device may be attached to the back surface of the base plate 10.

The semiconductor elements connected to the metal patterns are not limited to IGBTs and diodes. The concrete constructions of the semiconductor elements are not particularly specified restrictively if a main current is caused to flow between a first portion and a second portion; the first portion is electrically connected to the first metal pattern; and the second portion is electrically connected to the second metal pattern. The first portion is, for example, a collector or a cathode. The second portion is, for example, an emitter or an anode. An example of the semiconductor element is a switching element or a diode. Examples of the switching element other than the IGBT are a MOSFET, an SJMOS or a JFET.

Each semiconductor element may be formed of silicon or a wide-bandgap semiconductor having a bandgap larger than that of silicon. The wide-bandgap semiconductor is, for example, silicon carbide, a gallium nitride-based material or diamond. A large current is ordinarily caused to flow in a semiconductor element formed of a wide-bandgap semiconductor, because the withstand voltage and the allowable current density are high. Therefore, the difference between a high temperature of the semiconductor element and a low temperature of the semiconductor element is large and the connections degrade easily. In such a case, it is particularly important to increase the dissipation of heat at the connection by adopting the construction according to Embodiment 1 of the present invention.

A reduction in size of the semiconductor device can be achieved by adopting semiconductor elements formed of a wide-bandgap semiconductor. Each of the above-described modifications can be applied to semiconductor devices according to embodiments described below.

Embodiment 2

Figure 8:
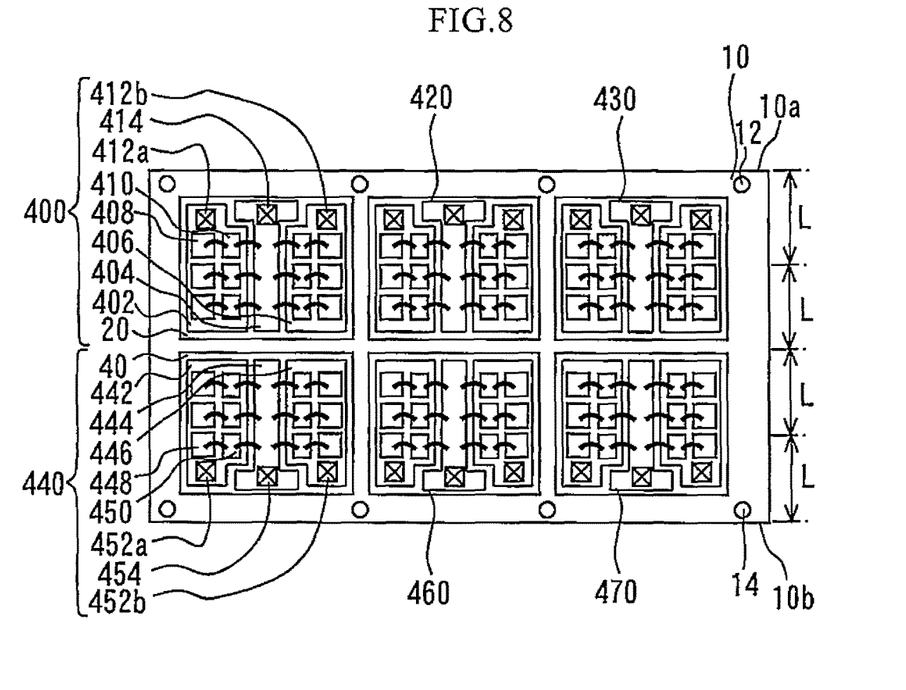
FIG. 8 is a plan view of the internal structure of the semiconductor device according to Embodiment 2 of the present invention.

A semiconductor device according to Embodiment 2 of the present invention has a number of commonalities with the semiconductor device according to Embodiment 1 and will therefore be described mainly with respect to points of difference from the semiconductor device according to Embodiment 1. FIG. 8 is a plan view of the internal structure of the semiconductor device according to Embodiment 2 of the present invention.

A plurality of unit structures are formed on a base plate 10. The plurality of unit structures include three first unit structures 400, 420, and 430 and three second unit structures 440, 460, and 470. The three first unit structures 400, 420, and 430 are formed nearer to and along a first side 10*a* of the base plate 10. The three second unit structures 440, 460, and 470 are formed nearer to and along a second side 10*b* of the base plate 10. The three first unit structures 400, 420, and 430 and the three second unit structures 440, 460, and 470 are bilaterally symmetrical about an imaginary line extending between and parallel to the first side 10*a* and the second side 10*b*.

The first unit structures will first be described. The three first unit structures 400, 420, and 430 are identical in construction to each other. Description will therefore be made below of the first unit structure 400. A first metal pattern 402, a second metal pattern 404 and a third metal pattern 406 insulated from each other are formed on an insulating substrate 20. The length of the second metal pattern 404 along the direction in which a main current flows is larger than twice the width of the second metal pattern 404.

The collectors of three IGBTs 408 and the cathodes of three diodes 410 are connected to the first metal pattern 402. Similarly, the collectors of three IGBTs and the cathodes of three diodes are connected to the third metal pattern 406. The emitters of the IGBTs and the anodes of the diodes are electrically connected to the second metal pattern 404 by wires formed of aluminum for example.

A first main electrode has first lower end portions 412*a* and 412*b*. The first lower end portion 412*a* is connected to the first metal pattern 402. The first lower end portion 412*b* is connected to the third metal pattern 406. A first lower end portion 414 of a second main electrode is connected to the second metal pattern 404.

The second unit structures will subsequently be described. The three second unit structures 440, 460, and 470 are identical in construction to each other. Description will therefore be made below of the second unit structure 440. A first metal pattern 442, a second metal pattern 444 and a third metal pattern 446 insulated from each other are formed on an insulating substrate 40.

The collectors of three IGBTs 448 and the cathodes of three diodes 450 are connected to the first metal pattern 442. Similarly, the collectors of three IGBTs and the cathodes of three diodes are connected to the third metal pattern 446. The emitters of the IGBTs and the anodes of the diodes are electrically connected to the second metal pattern 444 by wires.

The first main electrode has second lower end portions 452a and 452b. The first lower end portion 452a is connected to the first metal pattern 442. The first lower end portion 452b is connected to the third metal pattern 446. The second lower end portion 454 of the second main electrode is connected to the second metal pattern 444.

Figure 9:
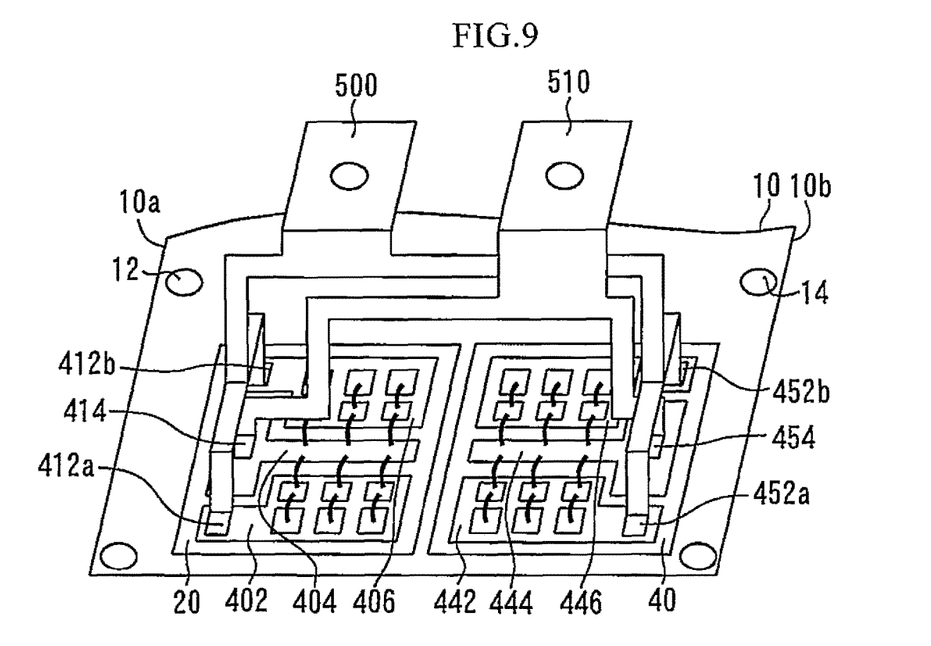
FIG. 9 is a perspective view of main electrodes and other components according to Embodiment 2 of the present invention.

FIG. 9 is a perspective view of main electrodes and other components according to Embodiment 2 of the present invention. A first main electrode 500 and a second main electrode 510 are illustrated. The feature of the semiconductor device according to Embodiment 2 of the present invention resides in that the first main electrode 500 has four lower end portions (first lower end portions 412a and 412b and second lower end portions 452a and 452b). In this feature, the number of connections of the first main electrode 500 is four. It is, therefore, possible to reduce the current density in each connection in comparison with the case where the number of connections of the first main electrode 100 is two as in the semiconductor device according to Embodiment 1. Degradation of the connections can therefore be inhibited.

Embodiment 3

Figure 10:
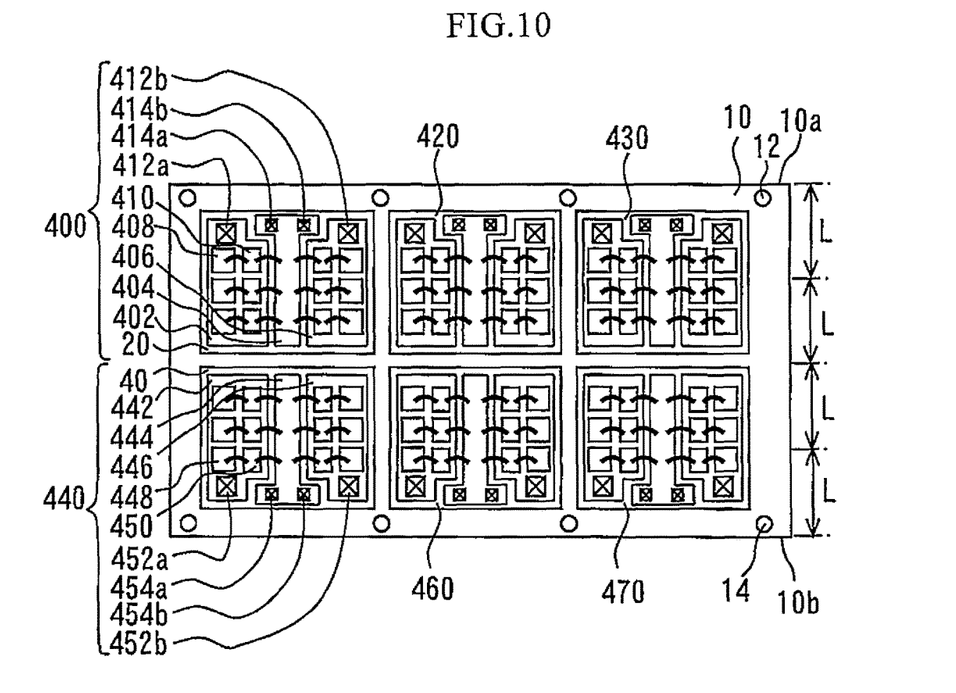
FIG. 10 is a plan view of the internal structure of the semiconductor device according to Embodiment 3 of the present invention.

A semiconductor device according to Embodiment 3 of the present invention has a number of commonalities with the semiconductor device according to Embodiment 2 and will therefore be described mainly with respect to points of difference from the semiconductor device according to Embodiment 2. FIG. 10 is a plan view of the internal structure of the semiconductor device according to Embodiment 3 of the present invention.

Figure 11:
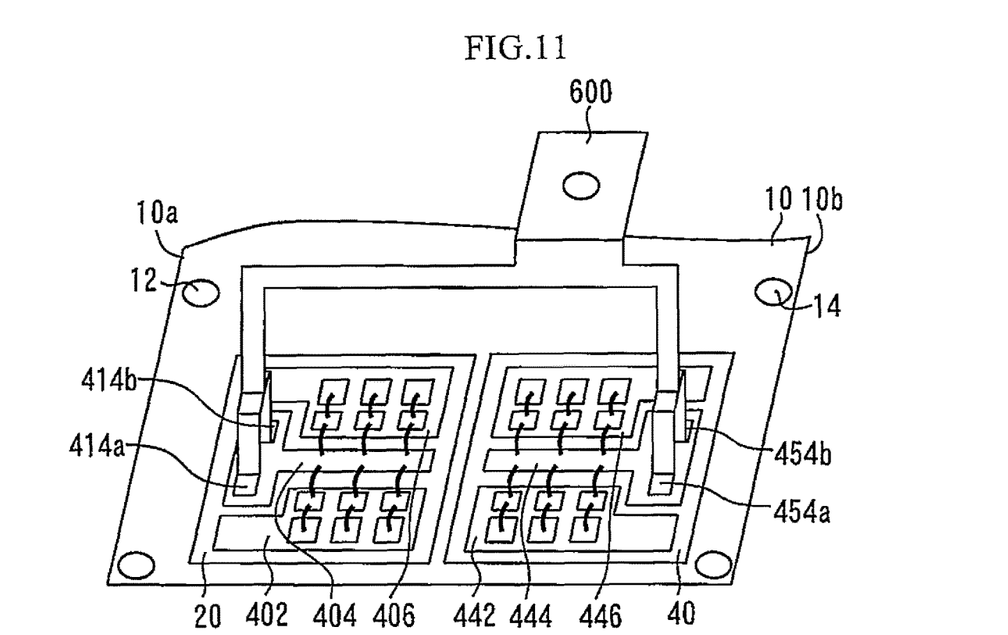
FIG. 11 is a perspective view of a second main electrode and other components according to Embodiment 3 of the present invention.

A second main electrode has first lower end portions 414a and 414b. The first lower end portions 414a and 414b are connected to the second metal pattern 404. The second main electrode also has second lower end portions 454a and 454b. The second lower end portions 454a and 454b are connected to the second metal pattern 444. FIG. 11 is a perspective view of a second main electrode and other components according to Embodiment 3 of the present invention. A second main electrode 600 is illustrated. The first main electrode is omitted in FIG. 11.

The second main electrode 600 has four lower end portions (first lower end portions 414a and 414b and second lower end portions 454a and 454b). In this feature, the number of connections of the second main electrode 600 is four. It is, therefore, possible to reduce the current density in each connection in comparison with the case where the number of connections of the second main electrode 110 is two as in the semiconductor device according to Embodiment 1. Degradation of the connections can therefore be inhibited.

Embodiment 4

Figure 12:
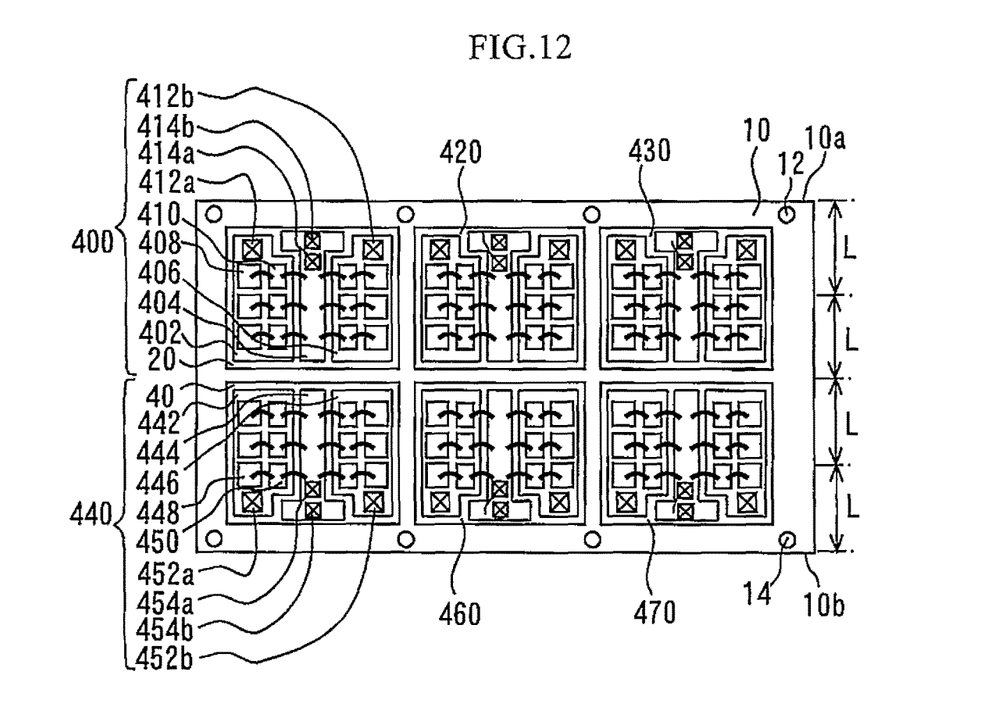
FIG. 12 is a plan view of the internal structure of the semiconductor device according to Embodiment 4 of the present invention.

A semiconductor device according to Embodiment 4 of the present invention has a number of commonalities with the semiconductor device according to Embodiment 3 and will therefore be described mainly with respect to points of difference from the semiconductor device according to Embodiment 3. FIG. 12 is a plan view of the internal structure of the semiconductor device according to Embodiment 4 of the present invention.

Figure 13:
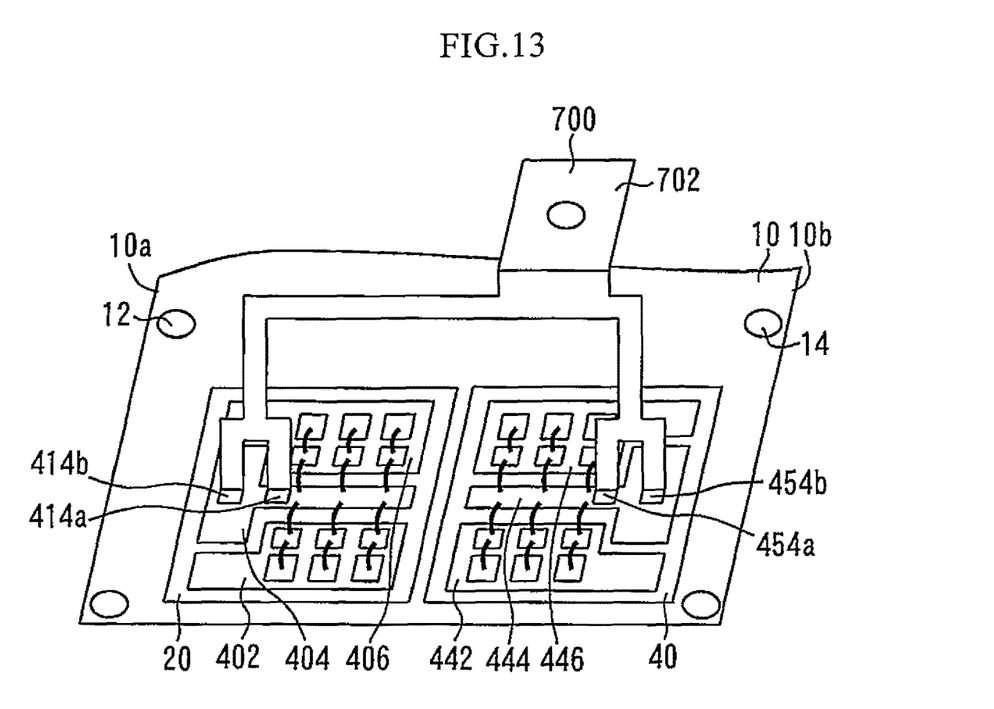
FIG. 13 is a perspective view of a second main electrode and other components according to Embodiment 4 of the present invention.

The first lower end portion 414a of the second main electrode is remoter from the outer edge of the base plate 10 than the first lower end portion 414b. The second lower end portion 454a of the second main electrode is remoter from the outer edge of the base plate 10 than the second lower end portion 454b. FIG. 13 is a perspective view of a second main electrode 700 and other components according to Embodiment 4 of the present invention. An upper end portion 702 of the second main electrode 700 is a portion exposed to the outside.

There is a possibility of one connection being remoter from the outer edge of the base plate than another connection for a reason relating to layout of connections. In the semiconductor device in Embodiment 4, the first lower end portion 414a and the second lower end portion 454a are remoter from the outer edge of the base plate 10 than the other lower end portions. However, each of the lower end portions including the first lower end portion 414a and the second lower end portion 454a is at the first side position or the second side position. Degradation of any of the connections can therefore be inhibited.

The semiconductor devices in Embodiments 2 to 4 of the present invention are characterized in that the main electrode has four lower end portions. More specifically, the main electrode has two first lower end portions and two second lower end portions. The current density in each connection can thereby be reduced. The number of first lower end portions and the number of second lower end portions are not limited to two. If the main electrode has two or more first lower end portions and two or more second lower end portions, the current density in each connection can be reduced.

A suitable combination of the features of the semiconductor devices according to the above-described embodiments may be made to improve the effects of the present invention.

DESCRIPTION OF SYMBOLS 10 base plate, 10a first side, 10b second side, 12 plurality of first through holes, 14 plurality of second through holes, 16,60,70 first unit structure, 18,80,90 second unit structure, 20, 40 insulating substrate, 22,42 first metal pattern, 24,44 second metal pattern, 26,46 IGBT, 28,48 diode, 30,50 wire, 32,34,62,64,72,74 first lower end portion, 52,54,82,84,92,94 second lower end portion, 100 first main electrode, 110 second main electrode, 102,112 upper end portion, 160 screws, 162 heat sink, 164 case, 400,420,430 first unit structure, 440,460,470 second unit structure, 412a,412b, 414a,414b first lower end portion, 452a,452b,454a,454b second lower end portion, 500 first main electrode, 510, 600,700 second main electrode

The invention claimed is:

1. A semiconductor device comprising:
a base plate formed into a rectangular shape as viewed in plan; and
a plurality of first unit structures and a plurality of second unit structures, the first unit structures formed nearer to a first side of the base plate than the second unit structures, and the plurality of second unit structures formed nearer to a second side of the base plate opposite from the first side than said first unit structures, each of the first and second unit structures including:
an insulating substrate fixed on the base plate;

a metal pattern formed on the insulating substrate;
a semiconductor element electrically connected to the metal pattern; and
a main electrode having an upper end portion exposed to the outside and at least one lower end portion, every lower end portion is only connected at a peripheral portion side of the metal pattern closest, among all peripheral side portions of the metal pattern, to an outer edge of the base plate, along one of the first side and the second side.

2. A semiconductor device comprising:
a base plate formed into a rectangular shape as viewed in plan; and
a plurality of unit structures formed on the base plate, each of the unit structures including:
an insulating substrate fixed on the base plate;
a metal pattern formed on the insulating substrate;
a semiconductor element electrically connected to the metal pattern; and
a main electrode having an upper end portion exposed to the outside and a lower end portion connected to a peripheral portion of the metal pattern closest to an outer edge of the base plate, wherein
the plurality of unit structures include a first unit structure formed on a first side of the base plate, and a second unit structure formed on a second side of the base plate opposite from the first side, and
the lower end portion of the main electrode includes
a first lower end portion attached to the peripheral portion of the first unit structure at a position along the first side, and
a second lower end portion attached to the peripheral portion of the second unit structure at a position along the second side.

3. The semiconductor device according to claim 1, wherein
the base plate has a plurality of first through holes formed along the first side of the base plate, and a plurality of second through holes formed along the second side, and
all the lower end portions are arranged along the plurality of first through holes or the plurality of second through holes.

4. The semiconductor device according to claim 3, further comprising:
screws passed through the plurality of first through holes and the plurality of second through holes; and
a cooling device connected to a back surface of the base plate with the screws.

5. The semiconductor device according to claim 3, wherein each of the lower end portions is located closer to the first side than a place defined by an advance from the first side toward the second side by ¼ of the distance from the first side to the second side or closer to the second side than a place defined by an advance from the second side toward the first side by ¼ of the distance from the second side to the first side.

6. The semiconductor device according to claim 1, wherein the metal pattern includes a first metal pattern and a second metal pattern insulated from the first metal pattern;
the semiconductor element has a main current caused to flow between a first portion and a second portion, has the first portion electrically connected to the first metal pattern, and has the second portion electrically connected to the second metal pattern; and
the main electrode includes a first main electrode connected to the first metal pattern, and a second main electrode connected to the second metal pattern.

7. The semiconductor device according to claim 2, wherein the main electrode has the two or more first lower end portions and the two or more second lower end portions.

8. The semiconductor device according to claim 1, wherein the semiconductor element is a switching element or a diode.

9. The semiconductor device according to claim 8, wherein the semiconductor element is formed of a wide-bandgap semiconductor.

10. The semiconductor device according to claim 9, wherein the wide-bandgap semiconductor is silicon carbide, a gallium nitride-based material or diamond.

11. The semiconductor device according to claim 6, wherein the length of the second metal pattern along the direction in which a main current flows is larger than twice the width of the second metal pattern.

12. The semiconductor device according to claim 1, wherein
the metal pattern includes a first metal pattern, a second metal pattern and a third metal pattern insulated from each other; and
the main electrode includes a first main electrode connected to the first metal pattern and to the third metal pattern, and a second main electrode connected to the second metal pattern.

13. A semiconductor device comprising:
a base plate formed into a rectangular shape as viewed in plan;
a first unit structure and a second unit structure, the first unit structure formed nearer to a first side of the base plate than the second unit structure, and the second unit structure formed nearer to a second side of the base plate opposite from the first side than said first unit structure, each of the first unit structure and the second unit structure overlie an insulating substrate and includes:
a metal pattern formed on the insulating substrate; and
a plurality of semiconductor switching elements, each switching element electrically connected to the metal pattern; and
a high potential side main electrode and a low potential side main electrode, each having an upper end portion exposed to the outside and at least one lower end portion, every lower end portion is only connected to a peripheral portion of the metal pattern closest to an outer edge of the base plate.

14. The semiconductor device according to claim 1, wherein each of the first unit structures is provided with at least one switching element and one diode, and each of the second unit structures is provided with at least one switching element and one diode.

15. The semiconductor device according to claim 13, wherein the high potential side main electrode is a collector electrode, and the low potential side is an emitter electrode.

16. The semiconductor device according to claim 13, wherein the high potential side main electrode is a drain main electrode, and the low potential side main electrode is a source main electrode.

17. The semiconductor device according to claim 13, wherein each lower end portion is positioned along one of the first and second side of the base plate.

18. The semiconductor device according to claim 13, wherein the lower end portion of the high potential side main electrode is positioned along the first side of the base plate, and the lower end portion of the low potential side main electrode is positioned along the second side of the base plate.

19. A semiconductor device comprising:
a base plate formed into a rectangular shape as viewed in plan; and
a plurality of first unit structures and a plurality of second unit structures, the first unit structures formed nearer to a first side of the base plate than the second unit structures, and the plurality of second unit structures formed nearer to a second side of the base plate opposite from the first side than said first unit structures, each of the first and second unit structures including:
an insulating substrate fixed on the base plate;
a metal pattern formed on the insulating substrate;
a semiconductor element electrically connected to the metal pattern; and
a main electrode having an upper end portion exposed to the outside and at least one lower end portion only connected at a peripheral portion side of the metal pattern closest, among all peripheral side portions of the metal pattern, to an outer edge of the base plate, along one of the first side and the second side,
the main electrode includes no lower end portion at a position other than the peripheral portion side of metal pattern.

20. A semiconductor device comprising:
a base plate formed into a rectangular shape as viewed in plan;
a first unit structure and a second unit structure, the first unit structure formed nearer to a first side of the base plate than the second unit structure, and the second unit structure formed nearer to a second side of the base plate opposite from the first side than said first unit structure, each of the first unit structure and the second unit structure overlie an insulating substrate and includes:
a metal pattern formed on the insulating substrate; and
a plurality of semiconductor switching elements, each switching element electrically connected to the metal pattern; and
a high potential side main electrode and a low potential side main electrode, each having an upper end portion exposed to the outside and at least one lower end portion only connected to a peripheral portion of the metal pattern closest to an outer edge of the base plate,
the main electrode includes no lower end portion at a position other than the peripheral portion side of metal pattern.

* * * * *